US010726880B2

(12) United States Patent
Hendrickson

(10) Patent No.: US 10,726,880 B2
(45) Date of Patent: Jul. 28, 2020

(54) REFERENCE VOLTAGE GENERATOR FOR RESISTIVE MEMORY ARRAY

(71) Applicant: Numem Inc., Sunnyvale, CA (US)

(72) Inventor: Nicholas T. Hendrickson, Burnsville, MN (US)

(73) Assignee: Numem Inc., Sunnyvale, CA (US)

( * ) Notice: Subject to any disclaimer, the term of this patent is extended or adjusted under 35 U.S.C. 154(b) by 0 days.

(21) Appl. No.: 16/179,739

(22) Filed: Nov. 2, 2018

(65) Prior Publication Data

US 2019/0130945 A1 May 2, 2019

Related U.S. Application Data

(60) Provisional application No. 62/580,968, filed on Nov. 2, 2017.

(51) Int. Cl.
*G11C 5/14* (2006.01)
*G11C 11/16* (2006.01)
*G11C 13/00* (2006.01)

(52) U.S. Cl.
CPC ............ *G11C 5/147* (2013.01); *G11C 11/161* (2013.01); *G11C 11/1653* (2013.01); *G11C 11/1655* (2013.01); *G11C 11/1673* (2013.01); *G11C 13/004* (2013.01); *G11C 13/0023* (2013.01); *G11C 13/0026* (2013.01); *G11C 2013/0054* (2013.01)

(58) Field of Classification Search
CPC .... G11C 5/147; G11C 11/161; G11C 11/1673
See application file for complete search history.

(56) References Cited

U.S. PATENT DOCUMENTS

| 6,055,178 | A | 4/2000 | Naji |
| 7,453,719 | B2 | 11/2008 | Sakimura et al. |
| 8,202,561 | B2 * | 6/2012 | Livaich ............ A23L 2/02 426/592 |
| 8,437,171 | B1 | 5/2013 | Gilbert |
| 9,443,586 | B2 * | 9/2016 | Park .............. G11C 13/004 |
| 9,659,624 | B1 | 5/2017 | Hendrickson et al. |

(Continued)

FOREIGN PATENT DOCUMENTS

| DE | 10 2006 060 257 B4 | 9/2010 |
| WO | 2016/068911 A1 | 5/2016 |
| WO | 2018/102557 A1 | 6/2018 |

OTHER PUBLICATIONS

International Search Report and Written Opinion for PCT/US2018/059076 dated Jan. 17, 2019 (10 Pages).

(Continued)

*Primary Examiner* — Pho M Luu
(74) *Attorney, Agent, or Firm* — Paradice & Li LLP

(57) ABSTRACT

An apparatus for storing data in a magnetic random access memory (MRAM) is provided. The MRAM may store data in one or more resistance-based memory cells and may include a plurality of comparators to compare a voltage generated based on the resistance-based memory cells to a reference voltage to determine a stored logic state. In some implementations, the reference voltage may be generated by a plurality resistance-based memory cells. The reference voltage may be adjusted higher or lower by storing different logic states within the resistance-based memory cells.

18 Claims, 8 Drawing Sheets

(56) References Cited

U.S. PATENT DOCUMENTS

| | | | |
|---|---|---|---|
| 9,812,198 B1* | 11/2017 | Chou | G11C 13/004 |
| 9,830,988 B2* | 11/2017 | Augustine | G11C 13/004 |
| 2005/0105334 A1 | 5/2005 | Futatsuyama | |
| 2005/0138580 A1 | 6/2005 | Lim et al. | |
| 2009/0010052 A1 | 1/2009 | Kang et al. | |
| 2009/0027953 A1 | 1/2009 | Kang et al. | |
| 2009/0268515 A1 | 10/2009 | Jeong et al. | |
| 2010/0118588 A1 | 5/2010 | Chen et al. | |
| 2012/0131523 A1 | 5/2012 | Lu et al. | |
| 2013/0265820 A1 | 10/2013 | Chih et al. | |
| 2014/0269124 A1 | 9/2014 | Seningen et al. | |
| 2016/0019943 A1 | 1/2016 | Chih et al. | |
| 2016/0365129 A1 | 12/2016 | Willcock | |
| 2017/0337308 A1 | 11/2017 | Rotenberg et al. | |
| 2018/0150576 A1 | 5/2018 | Gharia | |

OTHER PUBLICATIONS

International Search Report and Written Opinion for PCT/US2017/063969 dated Mar. 28, 2018 (12 Pages).

\* cited by examiner

REFERENCE VOLTAGE GENERATOR FOR RESISTIVE MEMORY ARRAY

CROSS-REFERENCE TO RELATED APPLICATION

This application claims the benefit of commonly owned U.S. Provisional Patent Application No. 62/580,968 entitled "REFERENCE VOLTAGE GENERATOR FOR RESISTIVE MEMORY ARRAY" filed on Nov. 2, 2017, the entirety of which is hereby incorporated by reference.

TECHNICAL FIELD

The disclosure herein relates generally to resistive memory arrays, and more specifically to a method and apparatus of generating a reference voltage for resistive memory arrays.

BACKGROUND

Magnetic random access memory (MRAM) devices are being developed as an alternative to conventional semiconductor memory devices for many applications including information storage, wireless and wireline communications, and/or information processing. MRAM devices provide persistent (non-volatile) storage with relatively high densities compared to conventional dynamic random access memory (DRAM) cells.

MRAM memory cells use resistive-based memory cells to represent stored data through different resistance values. Thus, resistance-based memory cells may exhibit a resistance that varies based on a stored logic state. Example resistance-based memory cells, may include, but are not limited to, spin-transfer-torque, spin-orbit-torque, resistor random access memory (ReRAM), phase change RAM, and/or carbon nanotube memory cells. By way of example, spin-torque-transfer memory relies on an equivalent resistance of a magnetic tunnel junction (MTJ) to provide non-volatile storage. The resistance-based memory cells may be programmed to different states (e.g., to represent a logic 0 or logic 1) by varying a current and/or a voltage driven through the memory cells during program (e.g., write) operations. During read operations, the resistance of the resistance-based memory cells may be determined by passing a controlled current through the cells and comparing the resulting voltage to a reference voltage.

The reference voltage for an MRAM array should not only be stable but should also enable the different states of the memory cells to be easily distinguished. Conventional approaches to reference voltage generation may not consider factors such as parasitic resistances and capacitances, local voltage fluctuations or bit line resistance-capacitance (RC) delays associated with MRAM arrays. These factors may cause uncertainty in the reference voltage and thereby cause erroneous data to be retrieved from the memory array. As such, it is desirable to have a voltage reference that may accommodate MRAM array implementations.

BACKGROUND

This Summary is provided to introduce in a simplified form a selection of concepts that are further described below in the Detailed Description. This Summary is not intended to identify key features or essential features of the claimed subject matter, nor is it intended to limit the scope of the claimed subject matter.

A magnetic random access memory (MRAM) array is disclosed. The MRAM array may include a plurality of memory data bit line groups configured to store data, a plurality of reference bit lines configured to provide a reference voltage, wherein the reference voltage is based on voltages provided by at least one resistive bit cell of each reference bit line, and a plurality of sense amps configured to compare a data bit line voltage from the plurality of memory data bit line groups to the reference voltage.

In another example, a voltage generator to provide a reference voltage is disclosed. The reference voltage generator may include a plurality of resistive bit cells configured to store a first logic state and a second logic state, wherein a reference voltage is provided based on a first number of resistive bit cells storing the first logic state and a second number of resistive bit cells storing the second logic state.

In another example, a magnetic random access memory (MRAM) array may include a means for storing data via a plurality of memory data bit line groups, a means for providing a reference voltage based on voltages provided by at least one resistive bit cell, and a means for comparing a data bit line voltage from the plurality of memory data bit line groups to the reference voltage.

BRIEF DESCRIPTION OF THE DRAWINGS

A further understanding of the nature and advantages of the present disclosure may be realized by reference to the following drawings. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Figure 1:
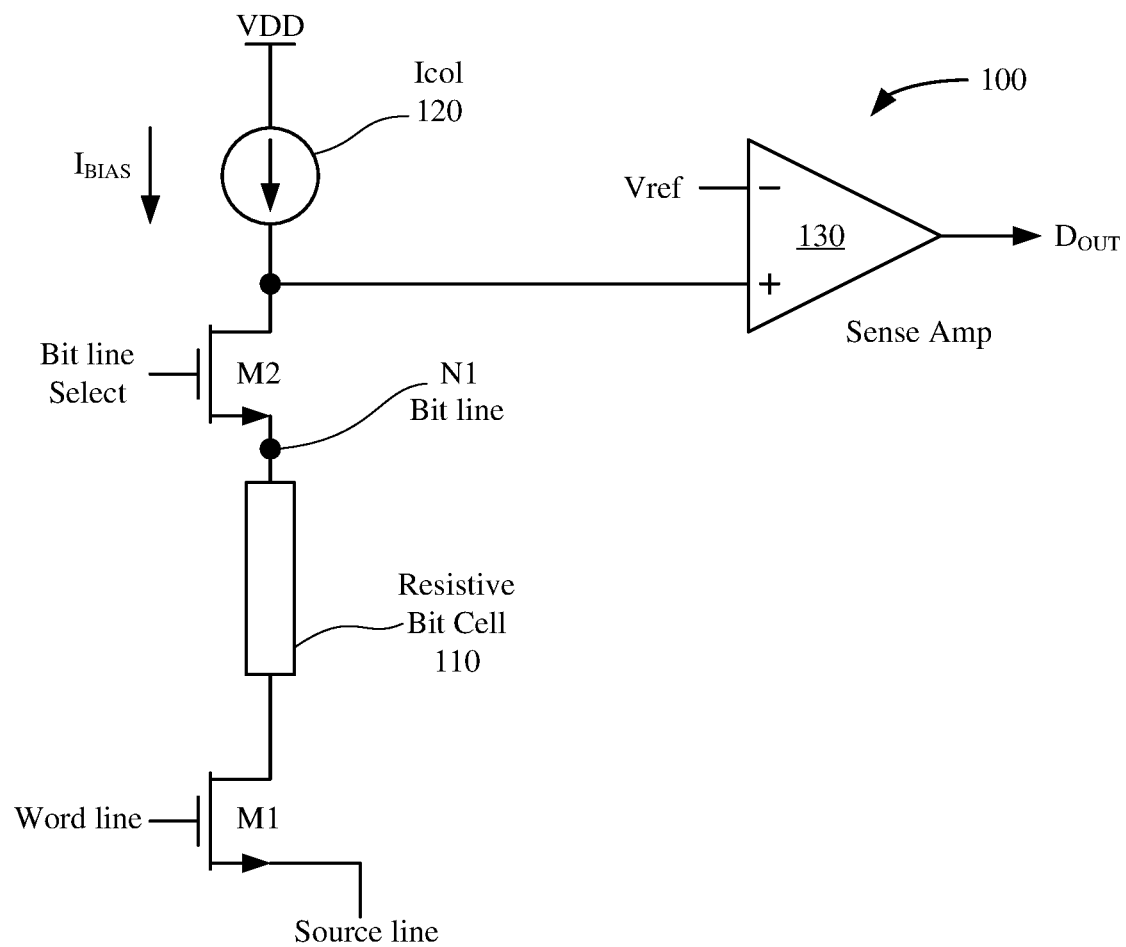
FIG. 1 is a simplified schematic diagram of a resistance-based memory cell, in accordance with some implementations.

In the following description, numerous specific details are set forth such as examples of specific components, circuits, and processes to provide a thorough understanding of the present disclosure. The term "coupled" as used herein means connected directly to or connected through one or more intervening components or circuits. Also, in the following description and for purposes of explanation, specific nomenclature is set forth to provide a thorough understanding of the present disclosure. However, it will be apparent to one skilled in the art that these specific details may not be required to practice the example implementations. In other instances, well-known circuits and devices are shown in block diagram form to avoid obscuring the present disclosure. The present disclosure is not to be construed as limited to specific examples described herein but rather to include within their scopes all implementations defined by the appended claims.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of the disclosure disclosed herein, whether implemented independently of or combined with any other aspect of the disclosure. For example, an apparatus may be implemented, or a method may be practiced using any number of the aspects set forth herein. In addition, the scope of the disclosure is intended to cover such an apparatus or method, which is practiced using other structure, functionality, or structure and functionality in addition to or other than the various aspects of the disclosure set forth herein. It should be understood that any aspect of the disclosure disclosed herein may be embodied by one or more elements of a claim. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in other examples.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present application, discussions utilizing the terms such as "accessing," "receiving," "sending," "using," "selecting," "determining," "normalizing," "multiplying," "averaging," "monitoring," "comparing," "applying," "updating," "measuring," "deriving" or the like, refer to the actions and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like. Also, "determining" may include measuring, estimating, and the like.

As used herein, the term "generating" encompasses a wide variety of actions. For example, "generating" may include calculating, causing, computing, creating, determining, processing, deriving, investigating, making, producing, providing, giving rise to, leading to, resulting in, looking up (e.g., looking up in a table, a database or another data structure), ascertaining and the like. Also, "generating" may include receiving (e.g., receiving information), accessing (e.g., accessing data in a memory) and the like. Also, "generating" may include resolving, selecting, choosing, establishing and the like.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any such list including multiples of the same members (e.g., any lists that include aa, bb, or cc).

In the figures, a single block may be described as performing a function or functions; however, in actual practice, the function or functions performed by that block may be performed in a single component or across multiple components, and/or may be performed using hardware, using software, or using a combination of hardware and software. To clearly illustrate this interchangeability of hardware and software, various illustrative components, blocks, modules, circuits, and steps are described below generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the claims.

FIG. 1 is a simplified schematic diagram 100 of an example resistance-based memory cell implementation. The schematic diagram 100 includes a resistive bit cell 110, a column current source $I_{COL}$ 120, a word line field effect transistor (FET) M1, a bit line FET M2, and a sense amp 130.

The column current source $I_{COL}$ 120 may provide a bias current $I_{BIAS}$ for the resistive bit cell 110. In some implementations, the column current source $I_{COL}$ 120 may provide the bias current $I_{BIAS}$ for an entire column of resistive bit cells (not shown for simplicity). The resistive bit cell 110 may exhibit a varying resistance based on whether a logic 0 or a logic 1 is stored within the cell. Example implementations of the resistive bit cell 110 may include, but are not limited to, spin-transfer-torque, spin-orbit-torque, resistor random access memory (ReRAM), phase change RAM, and/or carbon nanotube memory cells.

In some implementations, when the word line FET M1 and the bit line FET M2 are both enabled, a voltage is generated at node N1 (e.g., a bit line associated with the resistive bit cell 110) based, at least in part, on the resistance of the resistive bit cell 110 and the bias current $I_{BIAS}$. The sense amp 130 compares the voltage of the bit line through the bit line FET M2 to a reference voltage Vref and determines whether the voltage of the bit line (and therefore the resistive bit cell 110) is representative of a logic 0 or a logic 1. The source of the word line FET M1 may be coupled to any technically feasible voltage or node, shown here as "source line" for simplicity.

Figure 2:
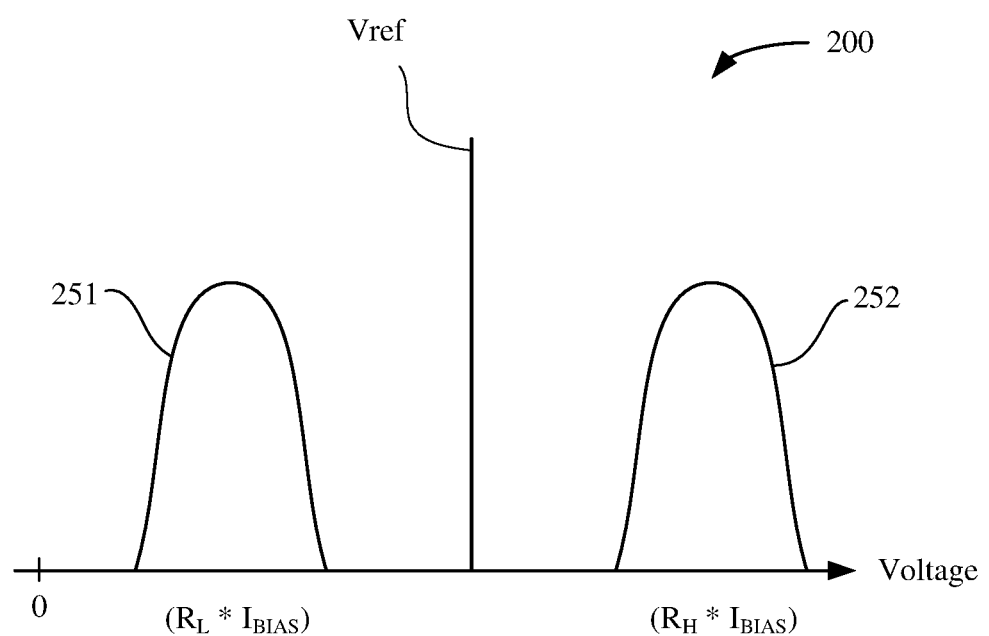
FIG. 2 is a graph 200 depicting a relationship between voltages associated with a resistance from the resistive bit cell 110 of FIG. 1 and the reference voltage Vref in accordance with some implementations.

FIG. 2 is a graph 200 depicting a relationship between voltages associated with a resistance from the resistive bit cell 110 of FIG. 1 and the reference voltage Vref in accordance with some implementations. The resistive bit cell 110 may be a "binary" bit cell and may have a first resistance when storing a first logic state and a second resistance when storing a second logic state. For example, the resistive bit cell 110 may have a resistance of approximately 2000 ohms when storing a logic 0 and a resistance of approximately 4000 ohms when storing a logic 1. In another example, the resistive bit cell 110 may have a resistance of approximately 2000 ohms when storing a logic 1 and a resistance of approximately 4000 ohms when storing a logic 0. In other implementations, any suitable resistance may represent any logic state or states.

As illustrated in FIG. 1, the column current source $I_{COL}$ 120 may provide a bias current $I_{BIAS}$ to the resistive bit cell 110. Thus, a first resistance $R_L$ due to the resistive bit cell 110 may provide a first voltage distribution 251 (e.g., $R_L * I_{BIAS}$) to represent a first logic state and a second resistance $R_H$ may provide a second voltage distribution 252 (e.g., $R_H * I_{BIAS}$) to represent a second logic state. The voltage reference Vref may be selected so that the first voltage distribution 251 is easily distinguished from the second voltage distribution 252. In this manner, the stored logic states of the resistive bit cell 110 may easily be distinguished.

Figure 3:
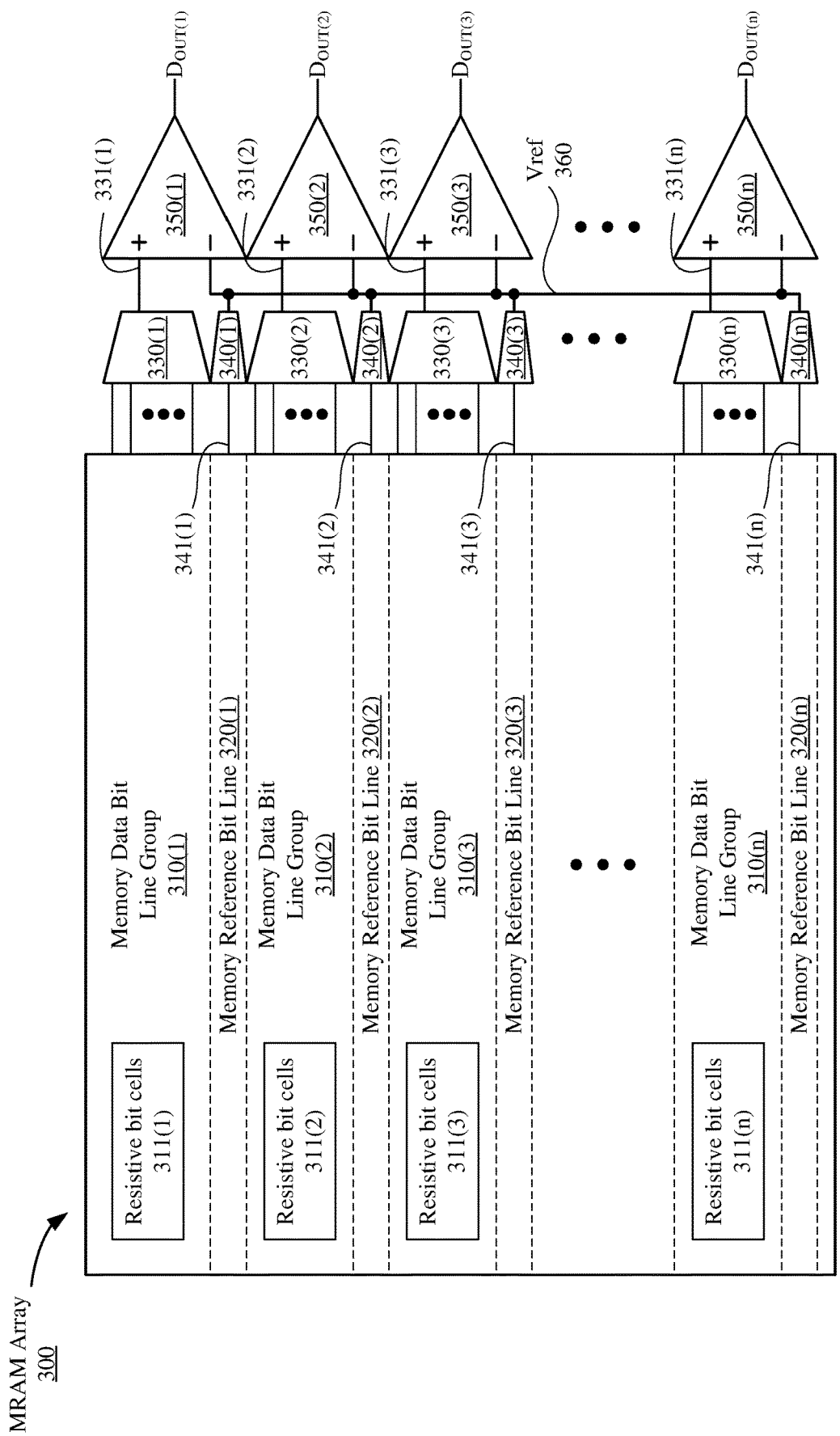
FIG. 3 depicts a block diagram of an implementation of a magnetic random access memory (MRAM) array.

FIG. 3 depicts a block diagram of an example implementation of a magnetic random access memory (MRAM) array 300. The MRAM array 300 may include a number of n memory data bit line groups 310(1)-310(n), n memory reference bit lines 320(1)-320(n), n memory data bit line multiplexers 330(1)-330(n), n reference bit line selectors 340(1)-340(n), and n sense amps 350(1)-350(n).

Each memory data bit line group 310(1)-310(n) may include resistive bit cells 311(1)-311(n) (such as an implementation of the resistive bit cell 110 of FIG. 1) arranged in an array (array not shown for simplicity). In some implementations, each memory data bit line group 310(1)-310(n) may store a one bit vector (e.g. one data bit) for a plurality of words. For example, a 32 bit word may include 32 memory data bit line groups that may be concatenated to form the 32 bit word.

The memory data bit line multiplexers 330(1)-330(n) may select one of the memory data bit lines (e.g., one of the resistive bit cells in the resistive bit cells 311(1)-311(n)) in the memory data bit line group 310(1)-310(n). For example, during a read operation, a memory data bit line within the memory data bit line group 310(1)-310(n) may be activated by word line and bit line signals (e.g., as shown in FIG. 1). The selected memory data bit lines 331(1)-331(n) may be coupled from the memory data bit line multiplexers 330(1)-330(n) to the sense amps 350(1)-350(n). The selected memory data bit lines 331(1)-331(n) may carry a voltage from a selected resistive bit cell from the resistive bit cells 311(1)-311(n) of the memory data bit line group 310(1)-310(n). In some implementations, the memory data bit line multiplexers 330(1)-330(n) may be at least partially implemented with a bit line FET (such as FET M2 of FIG. 1).

The sense amps 350(1)-350(n) may compare the voltage from the selected memory data bit lines 331(1)-331(n) with a reference voltage (Vref) 360. In some implementations, the sense amps 350(1)-350(n) may be an implementation of the sense amp 130 of FIG. 1. If the voltage associated with the selected memory data bit lines 331(1)-331(n) is greater than the Vref 360, then the data bit stored by the associated resistance bit cell (e.g., in the selected resistive bit cells 311(1)-311(n)) may be interpreted by the sense amps 350(1)-350(n) to be a first logic state. On the other hand, if the voltage associated with the selected memory data bit lines 331(1)-331(n) is less than the Vref 360, then the data stored by the associated resistance bit cell may be interpreted by the sense amps 350(1)-350(n) to be a second logic state. As shown, each sense amp 350(1)-350(n) may generate one output data bit. In this example, the sense amps 350(1)-350(n) may generate a n-bit word (Dout(1)-Dout(n)). In some implementations, the number n may be 32. In some other implementations, the number n may be any feasible number.

The memory reference bit lines 320(1)-320(n) may each generate a voltage that may be coupled together to generate the Vref 360. In some implementations, each memory reference bit line 320(1)-320(n) include at least one resistance-based memory cell (such as the resistance bit cell 110 of FIG. 1). In some implementations, the memory reference bit lines 320(1)-320(n) may each include a resistive bit cell similar to the resistive bit cells 311(1)-311(n) included in the memory data bit line groups 310(1)-310(n). The memory reference bit lines 320(1)-320(n) may be configured to generate one of two voltages: a first voltage based on the resistance $R_H$ or a second voltage based on the resistance $R_L$. The reference bit line selectors 340(1)-340(n) may provide a voltage 341(1)-341(n) from each of the memory reference bit lines 320(1)-320(n) to the Vref 360. In this manner, the Vref 360 may be determined by logic states of the resistive bit cells within the memory reference bit lines 320(1)-320(n).

Notably, the Vref 360 may be adjusted (trimmed) by the programming of the resistive bit cells included within the memory reference bit lines 320(1)-320(n). For example, increasing the number of resistive bit cells within the memory reference bit lines 320(1)-320(n) programmed to have the resistance $R_H$ and decreasing the number of resistive bit cells within the memory reference bit lines 320(1)-320(n) programmed to have the resistance $R_L$ may bias the Vref 360 toward the voltage associated with the resistance $R_H$. On the other hand, increasing the number of resistive bit cells within the memory reference bit lines 320(1)-320(n) programmed to have the resistance $R_L$ and decreasing the number of resistive bit cells within the memory reference bit lines 320(1)-320(n) programmed to have the resistance $R_H$ may bias the Vref 360 toward the voltage associated with the resistance $R_L$. In this manner, the Vref 360 may be adjusted to accommodate variations in manufacturing and operating conditions that may affect the MRAM array 300.

In some implementations, the $R_H$ and $R_L$ resistances may be alternated (interleaved) within the memory reference bit lines 320(1)-320(n) and the associated reference bit line selectors 340(1)-340(n). For example, the memory reference bit line 320(1) and the reference bit line selector 340(1) may provide a voltage associated with the resistance $R_H$, while the memory reference bit line 320(2) and the reference bit line selector 340(2) may provide a voltage associated with the resistance $R_L$. In a similar manner, the memory reference bit lines 320(3)-320(n) and the reference bit line selectors 340(3)-340(n) may alternate providing voltages associated with the resistances $R_H$ and $R_L$. In some implementations, a memory reference bit line 320(1)-320(n) may be disposed adjacent to a corresponding memory data bit line group 310(1)-310(n). More evenly distributed voltages associated with the $R_H$ and $R_L$ resistances across the area associated with the MRAM array 300 may enable the Vref 360 to more closely average out any voltage and/or parasitic fluctuations within the MRAM array 300. In one example, one half of the available memory reference bit lines 320(1)-320(n) may be configured to a first logic state and one half of the available memory reference bit lines 320(1)-320(n) may be configured to a second logic state. Such a configuration may provide a Vref 360 that may be an average (mean) of the voltage associated with the $R_H$ resistance and the voltage associated with the $R_L$ resistance. In another example, for a 32 bit word, 32 memory reference bit lines 320(1)-320(n) may be used to cooperatively generate the Vref 360. Notably, the bit width of a data word, and therefore the number of memory reference bit lines 320(1)-320(n), may be any feasible number.

Thus, the reference voltage Vref may be generated by the resistive bit cells of the memory reference bit lines 320(1)-320(n) connected in parallel though Vref 360. In some implementations, this connection achieves current-resistance (IR) averaging and/or resistance-capacitance (RC) averaging. For example, as multiple current sources (e.g., $I_{COL}$ 120 of the resistive bit cells within the memory reference bit lines 320(1)-320(n)) are connected together, the associated currents and capacitances are multiplied while their associated resistances are divided.

As described above, the Vref 360 may be based on similar resistive bit cell structures that may be used to implement resistive bit cells 311(1)-311(n). Therefore, the Vref 360 may advantageously track process variations, array parasitics, local voltage fluctuations, resistive-capacitive (RC) delays and other local and global aspects which may affect the operation of the MRAM array 300.

Figure 4:
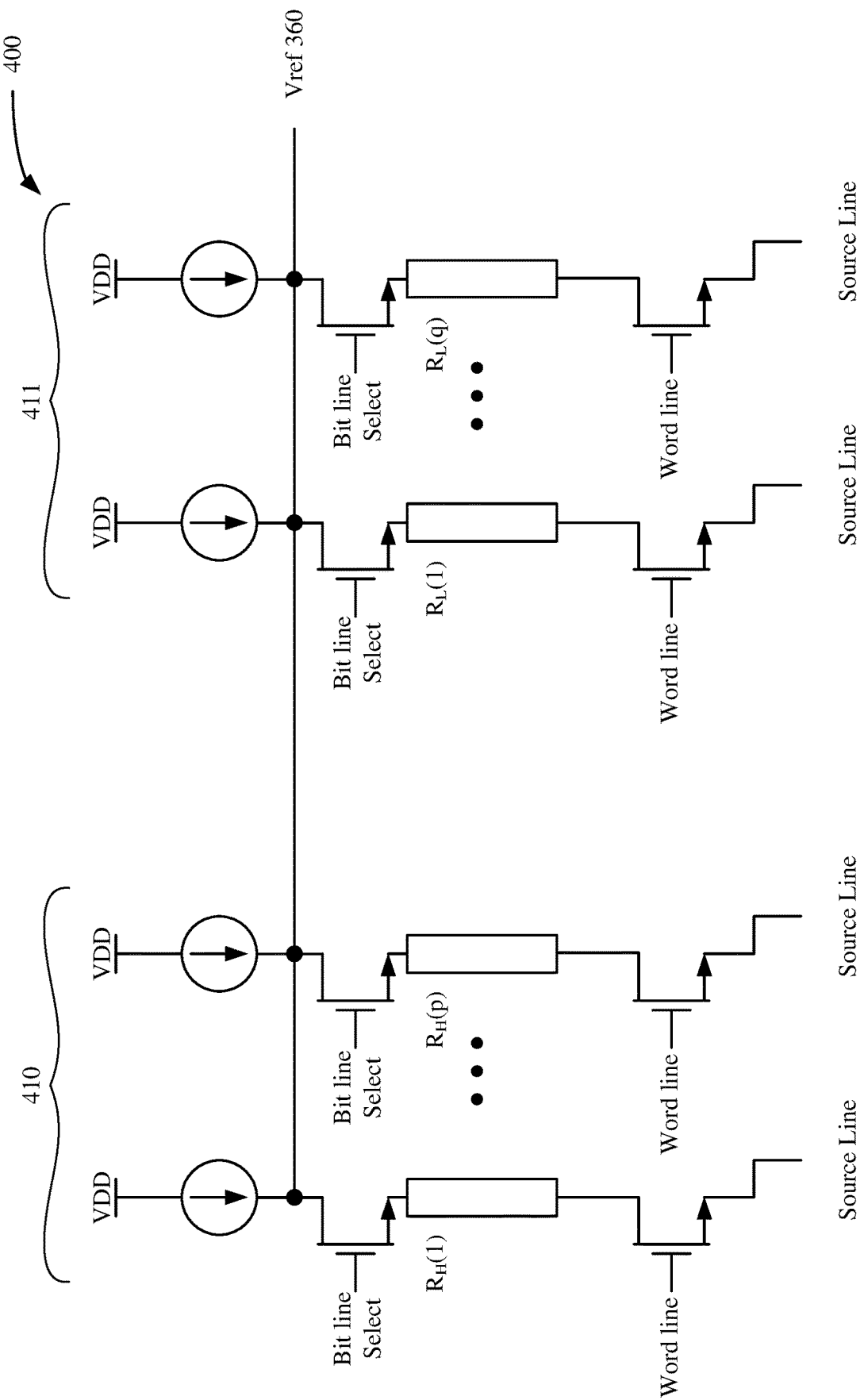
FIG. 4 is a simplified schematic diagram illustrating an example implementation of a plurality of the memory reference bit lines within the MRAM array of FIG. 3.

FIG. 4 is a simplified schematic diagram 400 illustrating an example implementation of a plurality of the memory reference bit lines within the MRAM array 300 of FIG. 3. As described above, each of the memory reference bit lines 320(1)-320(n) may generate a voltage associated with a resistance $R_H$ or a resistance $R_L$, and a number n of memory reference bit lines 320(1)-320(n) may be used to generate the Vref 360. To illustrate one implementation, the schematic diagram 400 shows first group 410 including a number of p $R_H$ resistors and a second group 411 including a number q $R_L$ resistors. In some implementations, the number of p $R_H$ resistors and the number q $R_L$ resistors may equal the number of bits n in the output word of the MRAM array 300 (e.g., p+q=n).

The Vref 360 may be trimmed by programming numbers of resistive bit cells included in the memory reference bit lines 320(1)-320(n) to have either a resistance $R_H$ or a resistance $R_L$. Thus, programming more resistive bit cells to generate voltages associated with the resistance $R_H$ and fewer resistive bit cells to generate voltages associated with the resistance $R_L$ may bias the Vref 360 toward the voltage associated with the resistance $R_H$. On the other hand, programming more resistive bit cells to generate voltages associated with the resistance $R_L$ and fewer resistive bit cells to generate voltages associated with the resistance $R_H$ may bias the Vref 360 toward the voltage associated with the resistance $R_L$. In this manner, the Vref 360 may be tuned (trimmed) to achieve near optimal performance. In other words, the Vref 360 may be tuned to be any possible voltage between a voltage associated with the resistance $R_H$ and the resistance $R_L$. Controlling Vref 360 is described in more detail below in conjunction with FIG. 5.

Figure 5:
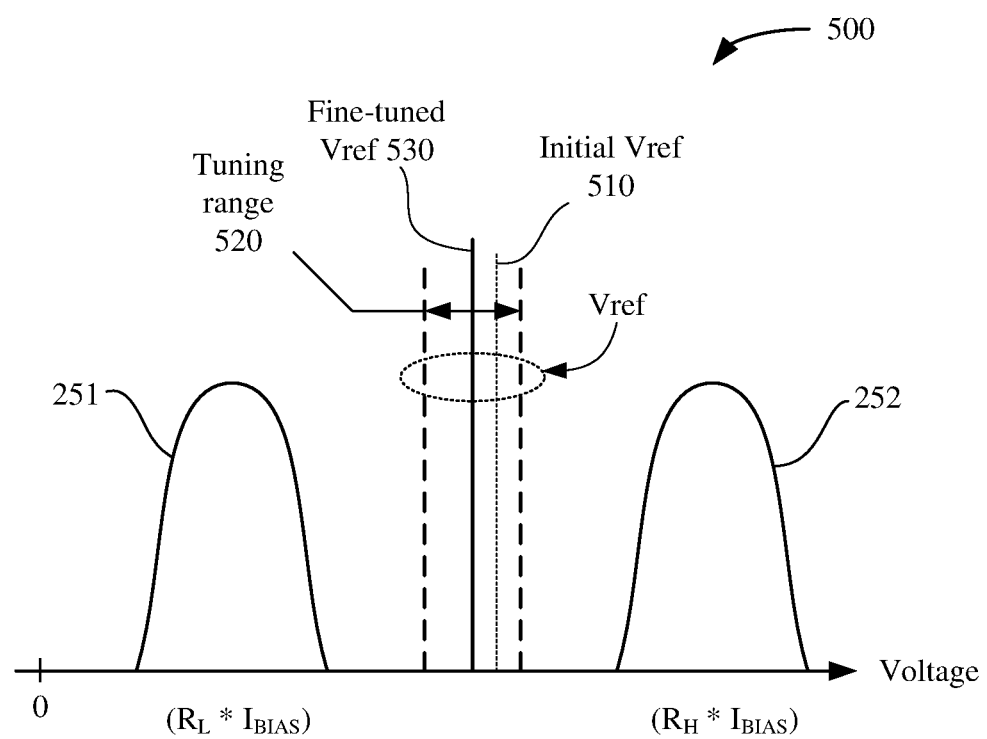
FIG. 5 is a graph 500 depicting another relationship between voltages associated with a resistance from the resistive bit cell of FIG. 1 and Vref.

FIG. 5 is a graph 500 depicting another relationship between voltages associated with a resistance from the resistive bit cell 110 of FIG. 1 and the Vref 360. As described above with respect to FIG. 2, the resistive bit cell 110 may be a binary bit cell and may have a first resistance when storing the first logic state and a second resistance when storing the second logic state. Further, the bias current $I_{BIAS}$ from current source $I_{COL}$ 120 of FIG. 1 may enable the generation of the first voltage distribution 251 and the second voltage distribution 252 of FIG. 2. As shown, an initial Vref 510 may not be symmetric between the first voltage distribution 251 and the second voltage distribution 252. The initial Vref 510 may be based on an initial number of resistive bit cells configured to provide a resistance $R_H$ and a second number of resistive bit cells configured to provide a resistance $R_L$. In some implementations Vref may be adjusted through a tuning range 520 by changing the distribution of resistances $R_H$ and resistances $R_L$ (for example, within the memory reference bit lines 320(1)-320(n) of the MRAM array 300) contributing to the Vref. In this manner, a fine-tuned Vref 530 may be adjusted to provide the Vref 360 (shown in FIG. 3). Persons having ordinary skill in the art will appreciate that there are many feasible approaches to fine tune the reference voltage Vref. For example, the first voltage distribution 251 and the second voltage distribution 252 may be characterized (measured) to determine an optimal voltage for Vref. In some implementations, Vref may be substantially midway between the first voltage distribution 251 and the second voltage distribution 252.

Figure 6:
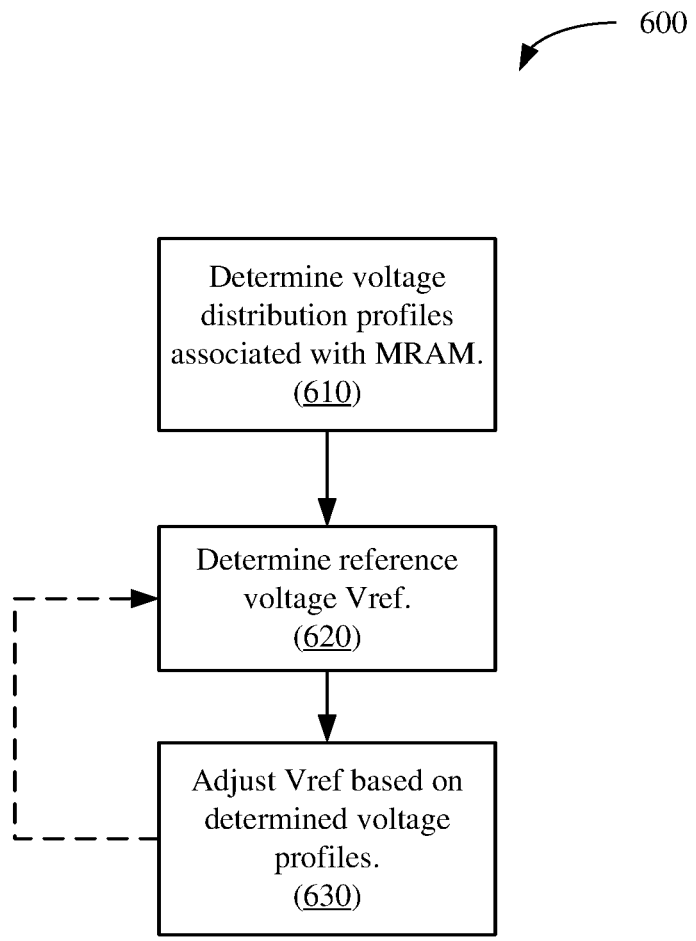
FIG. 6 is a flowchart depicting an example operation 600 for providing a reference voltage of an MRAM array.

FIG. 6 is a flowchart depicting an example operation 600 for providing a reference voltage of an MRAM array. Although described herein as being performed by a controller, the operation 600 may be performed by any feasible processor, computer system, state machine or other suitable device. The operation begins as the controller determines voltage distribution profiles associated with the MRAM array (610). In some implementations, the controller may characterize a plurality of resistive bit cells programmed into a first logic state and a second logic state to determine the associated voltage distribution profiles.

Next, the controller determines the reference voltage Vref (620). In some embodiments, the controller may configure a first number of resistive bit cells associated with the memory reference bit lines 320(1)-320(n) of FIG. 3 to the first logic state and a second number of resistive bit cells of the memory reference bit lines 320(1)-320(n) of FIG. 3 to the second logic state and determine (e.g., measure) the reference voltage Vref.

Next, the controller adjusts the Vref based on the determined reference voltage Vref and the determined voltage distribution profiles associated with the MRAM (630). In some implementations, the controller may change the distribution of resistive bit cells configured to store the first logic state and the second logic state to change the value of the voltage Vref. In some other implementations, the controller may optionally iterate the operation 600 by returning to 620 (optional iteration shown by dashed line in FIG. 6).

Figure 7:
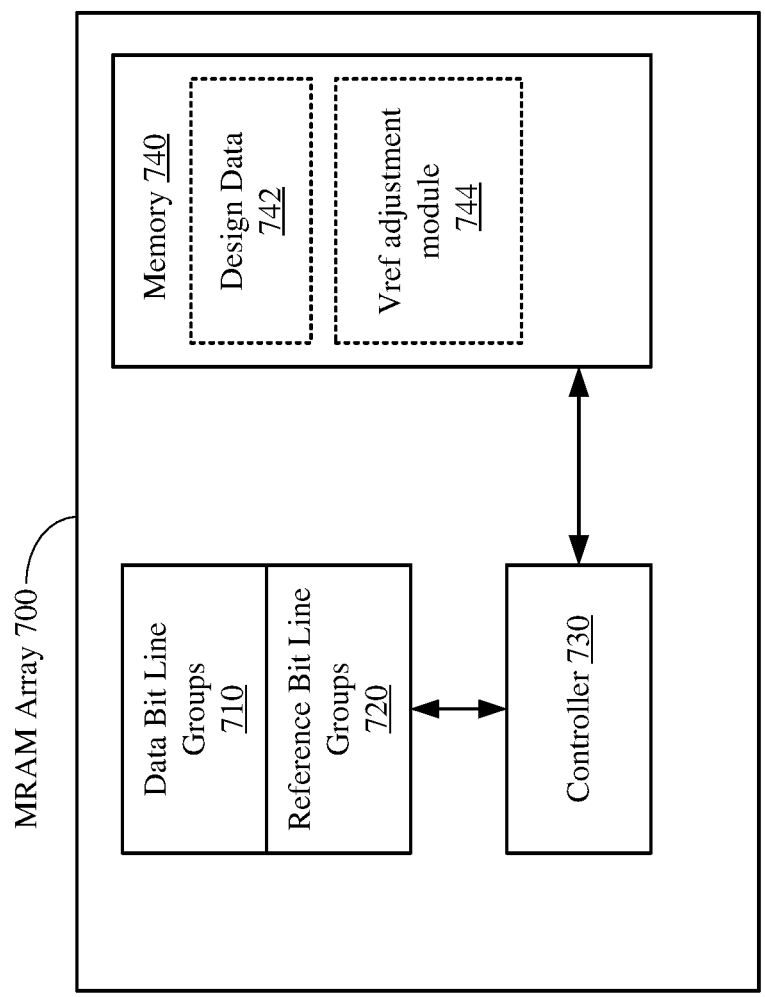
FIG. 7 depicts an implementation of a MRAM array.

FIG. 7 depicts an implementation of a MRAM array 700. The MRAM array 700 may be another implementation of the MRAM array 300 of FIG. 3. The MRAM array 700 may include data bit line groups 710, reference bit line groups 720, a controller 730, and a memory 740. The controller 730 may be coupled to the data bit line groups 710 and the memory data bit line groups 720. The data bit line groups 710 may be an implementation of the memory data bit line groups 310(1)-310(n) of FIG. 3. The memory data bit line groups 710 may include one or more resistive bit cells configured to store data (not shown for simplicity). In a similar manner, the reference bit line groups 720 may be an implementation of the memory reference bit lines 320(1)-320(n) of FIG. 3. The reference bit line groups 720 may be configured to provide one or more voltages that may, in turn, be used to provide a reference voltage Vref.

The controller 730, which is also coupled to the memory 740, may be any one or more suitable controllers capable of executing scripts or instructions of one or more software programs stored within the MRAM array 700 (e.g., within the memory 740). In some implementations, the controller 730 and the memory 740 may be separate from the MRAM array 700. For example, the controller 730 and the memory 740 may be in a chip or die separate from the data bit line groups 710 and/or the memory data bit line groups 720. In one implementation, the controller 730 may be a host processor and the memory 740 may be system memory associated with the host processor.

The memory 740 may be a solid state, magnetic, optical, magneto-optical, or any other suitable device capable of transient and/or non-volatile storage. The memory 740 may store design data 742. The design data 742 may include design information associated with the MRAM array 700. For example, the design data 742 may include information describing the number of resistive bit cells included within the reference bit line groups 720. Further, memory 740 may also include a non-transitory computer-readable storage medium (e.g., one or more nonvolatile memory elements, such as EPROM, EEPROM, Flash memory, a hard drive, etc.) that may include a Vref adjustment module 744.

The controller 730 may execute the Vref adjustment module 744 to generate and/or adjust the generation of a reference voltage Vref as described above with respect to FIG. 6. In some implementations, execution of the Vref adjustment module 744 may cause a determination (e.g., measurement) of Vref and configuration of one or more resistive bit cells into a first logic state or a second logic state to adjust the reference voltage Vref.

Figure 8:
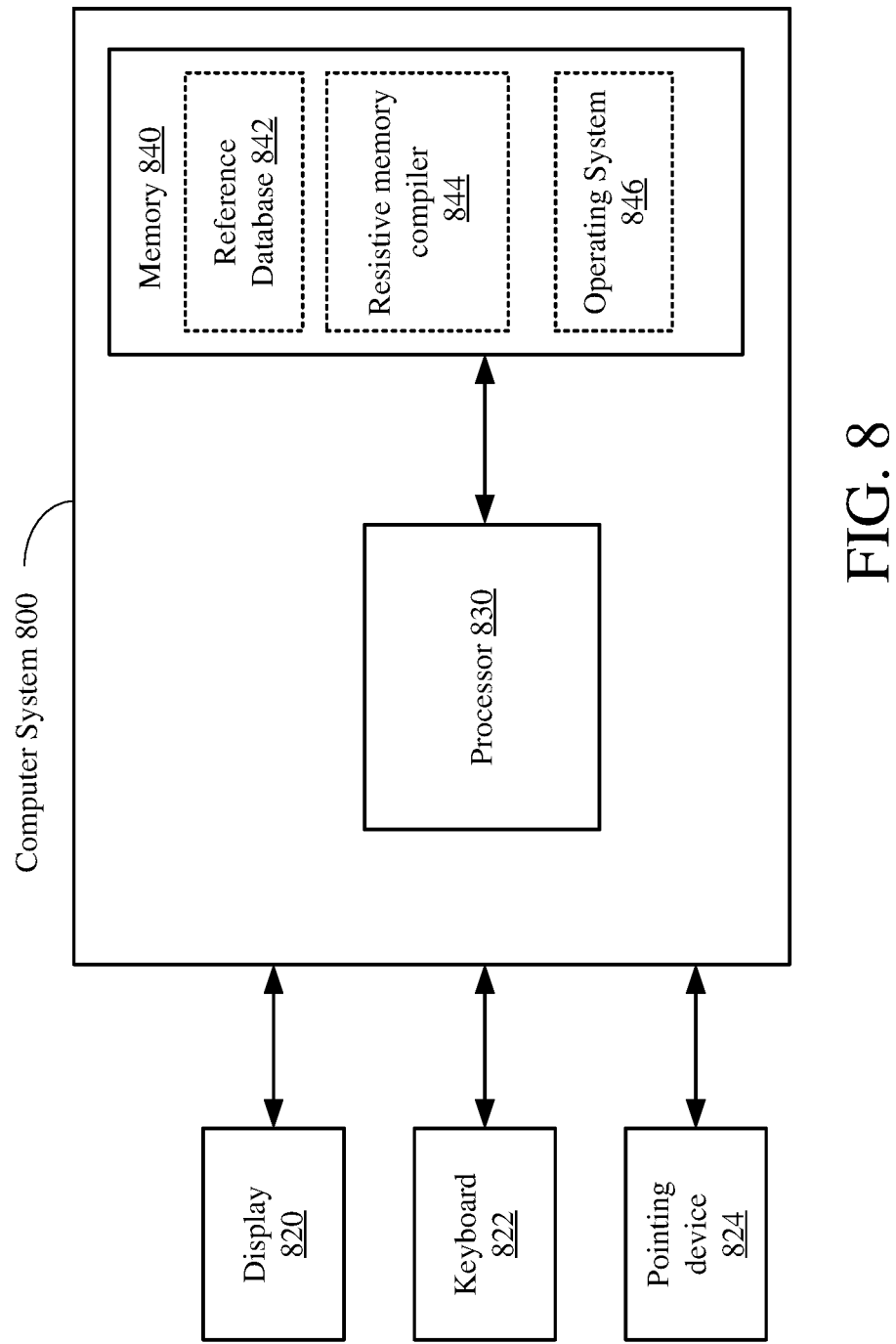
FIG. 8 depicts an implementation of a computer system.

FIG. 8 depicts an implementation of a computer system 800. The computer system 800 may include a processor 830 and a memory 840. The processor 830, which is coupled to the memory 840, may be any one or more suitable processors capable of executing scripts or instructions of one or more software programs stored within the computer system 800 (e.g., within the memory 840).

The computer system 800 may be coupled to a display 820, a keyboard 822, and a pointing device 824. The memory 840 may be a solid state, magnetic, optical, magneto-optical, or any other suitable device capable of transient and/or non-volatile storage. The memory 840 may store a reference database 842. The reference database 842 may include design information associated one or more resistive memory arrays. For example, the reference database 842 may include files describing a spin-transfer-torque, a spin-orbit-torque, or a carbon nanotube memory structure (e.g., files for one or more technology dependent arrangement of bit cells, sense amplifiers (amps), multiplexers, etc.). Further, memory 840 may also include a non-transitory computer-readable storage medium (e.g., one or more nonvolatile memory elements, such as EPROM, EEPROM, Flash memory, a hard drive, etc.) that may include a resistive memory compiler 844 and an operating system 846.

The processor 830 may execute the operating system 846 to manage the computer system 800 hardware and provide services for execution of one or more computer programs.

The processor 830 may execute the resistive memory compiler 844 to generate one or more output files (design files) associated with the MRAM array 300. The output files may include register transfer language (RTL) files and/or database files to instantiate the MRAM array 300 within a hierarchal or other suitable design. In addition, the output files may also include RTL and/or database files to instantiate memory reference bit lines and selectors (such as memory reference bit lines 320(1)-320(n) and reference bit line selectors 340(1)-340(n) described above with respect to FIG. 3).

The processor 830 may be responsible for managing the bus and general processing, including the execution of software stored on machine-readable media (e.g., within the memory 840). The processor 830 may be implemented with one or more general-purpose and/or special-purpose processors. Examples include microprocessors, microcontrollers, DSP processors, and other circuitry that can execute software. Software shall be construed broadly to mean instructions, data, or any combination thereof, whether referred to as software, firmware, middleware, microcode, hardware description language, or otherwise. Machine-readable media may include, by way of example, RAM (Random Access Memory), flash memory, ROM (Read Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof. The machine-readable media may be embodied in a computer-program product. The computer-program product may comprise packaging materials.

The various illustrative logical blocks, modules and circuits described in connection with the present disclosure may be implemented or performed with a general-purpose processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The bus may also link various other circuits such as timing sources, peripherals, voltage regulators, power management circuits, and the like, which are well known in the art, and therefore, will not be described any further.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A magnetic random access memory (MRAM) array comprising:
   a plurality of memory data bit line groups configured to store data;

a plurality of reference bit lines configured to provide a reference voltage, wherein the reference voltage is based on voltages provided by at least one resistive bit cell of each reference bit line, wherein the reference bit lines comprise a first number of resistive bit cells configured to store a first logic state and a second number of resistive bit cells configured to store a second logic state; and a plurality of sense amps configured to compare a data bit line voltage from the plurality of memory data bit line groups to the reference voltage.

2. The MRAM array of claim 1, wherein a first voltage is associated with the first logic state and a second voltage is associated with the second logic state.

3. The MRAM array of claim 2, wherein the reference voltage is between the first voltage associated with the first logic state and the second voltage associated with the second logic state.

4. The MRAM array of claim 1, wherein the plurality of reference bit lines is further configured to provide a reference voltage based on the first number of resistive bit cells and the second number of resistive bit cells.

5. The MRAM array of claim 1, wherein the first number of resistive bit cells is equal to the second number of resistive bit cells.

6. The MRAM array of claim 1, wherein the reference voltage is based on an average of voltages provided by the at least one resistive bit cell.

7. The MRAM array of claim 1, wherein each reference bit line is disposed adjacent to a corresponding memory data bit line group.

8. The MRAM array of claim 1, wherein the plurality of memory data bit line groups are configured to store data in one or more resistive bit cells.

9. The MRAM array of claim 1, wherein each data bit line group is configured to form a single bit vector of a data word.

10. The MRAM array of claim 1, further comprising:
a multiplexer configured to select at least one data bit line from the plurality of memory data bit line groups and couple a data bit line from the memory data bit line groups to a sense amp of the plurality of sense amps.

11. The MRAM array of claim 1, wherein the reference voltage is substantially midway between a voltage distribution associated with a first logic state of a resistive bit cell and a voltage distribution associated with a second logic state of the resistive bit cell.

12. The MRAM array of claim 1, wherein the at least one resistive bit cell is selected from the group consisting of spin-transfer-torque cells, spin-orbit-torque cells, resistor random access memory (ReRAM) cells, phase change RAM cells, and carbon nanotube memory cells.

13. A voltage generator to provide a reference voltage comprising:
a plurality of resistive bit cells configured to store a first logic state and a second logic state, wherein a reference voltage is provided based on a first number of resistive bit cells storing the first logic state and a second number of resistive bit cells storing the second logic state.

14. The voltage generator of claim 13, wherein the reference voltage is between a first voltage associated with the first logic state and a second voltage associated with the second logic state.

15. The voltage generator of claim 13, wherein the first number of resistive bit cells is equal to the second number of resistive bit cells.

16. The voltage generator of claim 13, wherein the reference voltage is substantially midway between a voltage distribution associated with the first logic state and a voltage distribution associated with the second logic state.

17. The voltage generator of claim 13, wherein the resistive bit cells are selected from the group consisting of spin-transfer-torque cells, spin-orbit-torque cells, resistor random access memory (ReRAM) cells, phase change RAM cells, and carbon nanotube memory cells.

18. A magnetic random access memory (MRAM) array comprising:
means for storing data via a plurality of memory data bit line groups;
means for providing a reference voltage based on voltages provided by at least one resistive bit cell, wherein the means comprises a first number of resistive bit cells configured to store a first logic state and a second number of resistive bit cells configured to store a second logic state; and
means for comparing a data bit line voltage from the plurality of memory data bit line groups to the reference voltage.

* * * * *